US 8,456,085 B2

(12) United States Patent
Han

(10) Patent No.: US 8,456,085 B2
(45) Date of Patent: Jun. 4, 2013

(54) ORGANIC LIGHT EMITTING DIODE DISPLAY HAVING SCATTERING PORTION

(75) Inventor: Byung-Uk Han, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 79 days.

(21) Appl. No.: 12/948,475

(22) Filed: Nov. 17, 2010

(65) Prior Publication Data

US 2011/0122628 A1 May 26, 2011

(30) Foreign Application Priority Data

Nov. 26, 2009 (KR) .................. 10-2009-0115321

(51) Int. Cl.
*H01L 51/52* (2006.01)
(52) U.S. Cl.
USPC ..................... 313/512; 313/503; 362/267
(58) Field of Classification Search
None
See application file for complete search history.

(56) References Cited

U.S. PATENT DOCUMENTS

| 7,345,419 B2 * | 3/2008 | Gotoh et al. ............. 313/504 |
| 7,548,021 B2 * | 6/2009 | Cok et al. ............... 313/506 |
| 2006/0279209 A1 * | 12/2006 | Yamaguchi et al. ....... 313/512 |

FOREIGN PATENT DOCUMENTS

| JP | 2009211885 A | 9/2009 |
| KR | 10-2003-0077976 | 10/2003 |
| KR | 1020040079019 | 9/2004 |
| KR | 10-0454748 | 10/2004 |
| KR | 1020050110910 | 11/2005 |
| KR | 100552960 B | 2/2006 |
| KR | 1020060040452 | 5/2006 |
| KR | 1020070111349 | 11/2007 |
| KR | 10-2009-0016972 | 2/2009 |

OTHER PUBLICATIONS

Machine translation of Applicant cited JP2009-211885 A published Sep. 17, 2009.*

* cited by examiner

*Primary Examiner* — Britt D Hanley
(74) *Attorney, Agent, or Firm* — Robert E. Bushnell, Esq.

(57) ABSTRACT

An organic light emitting diode (OLED) display includes a first substrate; a second substrate disposed to face the first substrate, an OLED disposed between the first and second substrates, and a sealant disposed between the first substrate and the second substrate. The organic light emitting diode emits light. The sealant seals a space between the first substrate and the second substrate. The organic light emitting diode is enclosed by the sealant and is spaced apart from the sealant by a predetermined gap. The OLED display further includes a scattering portion positioned at a seal area that covers the predetermined gap. The scattering portion scatters light incident into the scattering portion.

13 Claims, 9 Drawing Sheets

ORGANIC LIGHT EMITTING DIODE DISPLAY HAVING SCATTERING PORTION

CLAIM OF PRIORITY

This application makes reference to, incorporates the same herein, and claims all benefits accruing under 35 U.S.C. §119 from an application earlier filed in the Korean Intellectual Property Office on 26 Nov. 2009 and there duly assigned Serial No. 10-2009-0115321.

BACKGROUND OF THE INVENTION

1. Field of the Invention

The described technology relates generally to an organic light emitting diode (OLED) display. More particularly, the described technology relates generally to an OLED display that includes two substrates attached together by a sealant.

2. Description of the Related Art

A display device is a device that displays an image, and currently, an organic light emitting diode (OLED) display is in the spotlight.

The OLED display has self luminous characteristics and does not require a separate light source, unlike a liquid crystal display device, and thus can have reduced thickness and weight. Further, the OLED display represents high quality characteristics such as low power consumption, high luminance, and a high reaction speed.

In general, the OLED display includes a first substrate, an OLED that is positioned on the first substrate, a second substrate that is positioned to face the first substrate with the OLED interposed therebetween, and a sealant, such as frit, that is attached to the first and second substrates and seals the space between the first substrate and the second substrate.

In order to bond and seal the first substrate and the second substrate, a sealant is interposed between the first substrate and the second substrate, and a differential pressure is applied between an inner space, which is formed by the first substrate, the sealant and the second substrate, and an outer space, which is formed by the first substrate, the sealant and the outside of the second substrate, in a state in which the first substrate and the second substrate are pressurized while interposing the sealant therebetween. The sealant was cured using a curing means such as a laser, and a display substrate and an encapsulation substrate are attached and sealed with the OLED therebetween.

Even if the sealant is cured, different pressure is formed between the inner space and the outer space of the OLED display, and a central portion of at least one of the first substrate and the second substrate corresponding to the OLED is bent in the other direction due to the differences of the pressure.

However, because a portion of the first substrate or the second substrate that corresponds to the sealant and that contacts the sealant sustains a state that is protruded upward further than the other portion, a portion of the protruded portion is bent. In this way, if a portion of the protruded portion of the first substrate or the second substrate is bent, there is a problem that a Newton's ring phenomenon occurs in the bent portion.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an organic light emitting diode (OLED) display minimizing a Newton's ring phenomenon.

An exemplary embodiment provides an OLED display including a first substrate, a second substrate disposed to face the first substrate, an organic light emitting diode disposed between the first substrate and the second substrate, a sealant positioned between the first substrate and the second substrate where the organic light emitting diode is spaced apart from the sealant by a predetermined gap, and a scattering portion positioned at a seal area covering the sealant and the predetermined gap. The organic light emitting diode emits light. The sealant seals a space between the first substrate and the second substrate. The scattering portion scatters incident light into the scattering portion.

The sealant may enclose the organic light emitting diode along an edge portion of the second substrate, and the sealant may be positioned only at the edge portion of the second substrate.

A portion of the edge portion of the second substrate may be bent. The scattering portion may be disposed on the bent portion of the edge portion of the second substrate.

The OLED display may further include an optical plate that is positioned on the second substrate, wherein the scattering portion may be positioned on the optical plate.

The second substrate may include an inner surface that faces the first substrate. The inner surface of the second substrate may have a substrate groove, and the scattering portion may be disposed in the substrate groove. The scattering portion may cover the predetermined gap. The scattering portion may be formed on the inner surface of the second substrate, and the scattering portion may include protrusions and depressions.

The scattering portion may be formed by patterning the second substrate.

The scattering portion may include a base layer, and scattering particles disposed inside the base layer.

The scattering portion may be formed in a protrusion and depression shape including a plurality of recesses and a plurality of protrusions.

The protrusion may be formed in a shape of a quadrangle, a triangle, or a circle.

According to the exemplary embodiment, an OLED display that minimizes a Newton's ring phenomenon is provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
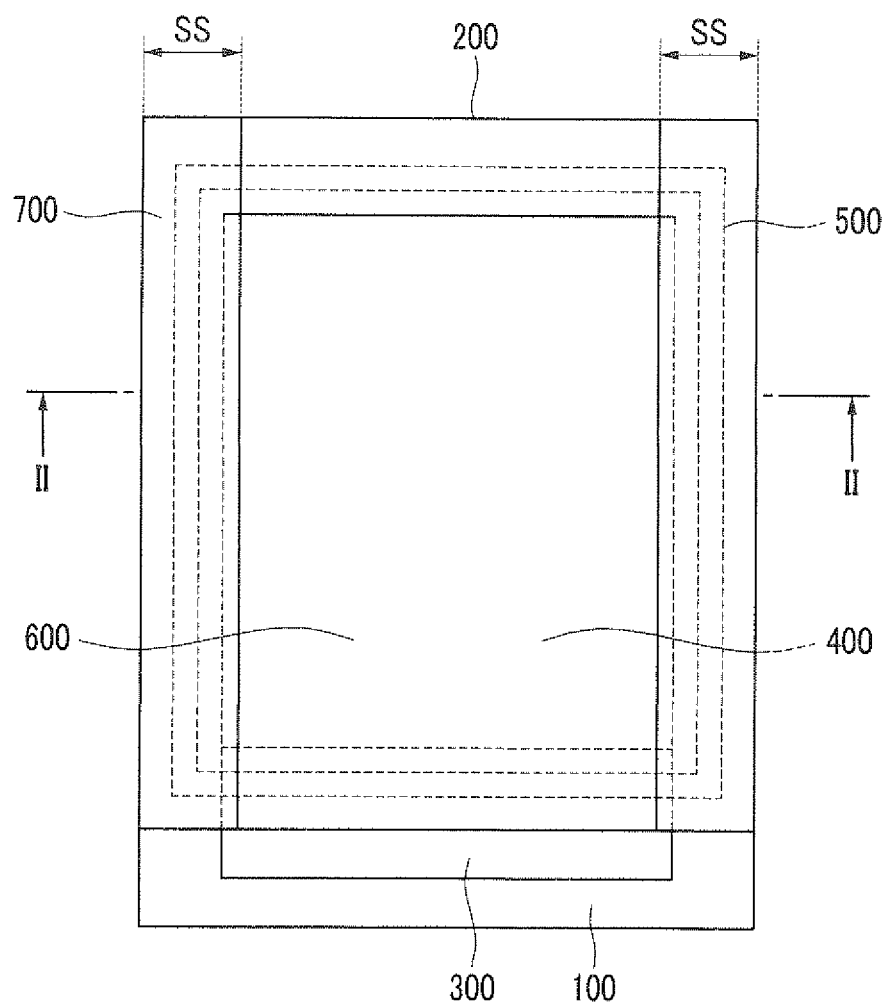
FIG. 1 is a top plan view illustrating an OLED display according to a first exemplary embodiment.

A display device is a device that displays an image, and currently, an organic light emitting diode (OLED) display is in the spotlight. The OLED display has self luminous characteristics and does not require a separate light source, unlike a liquid crystal display device, and thus can have reduced thickness and weight. Further, the OLED display represents high quality characteristics such as low power consumption, high luminance, and a high reaction speed.

In general, the OLED display includes a first substrate, an OLED that is positioned on the first substrate, a second substrate that is positioned to face the first substrate with the OLED interposed therebetween, and a sealant, such as flit, that is attached to the first and second substrates and seals the space between the first substrate and the second substrate.

In order to bond and seal the first substrate and the second substrate, a sealant is interposed between the first substrate and the second substrate, and a differential pressure is applied between an inner space, which is formed by the first substrate, the sealant and the second substrate, and an outer space, which is formed by the first substrate, the sealant and the outside of the second substrate, in a state in which the first substrate and the second substrate are pressurized while interposing the sealant therebetween. The sealant was cured using a curing means such as a laser, and a display substrate and an encapsulation substrate are attached and sealed with the OLED therebetween.

Even if the sealant is cured, different pressure is formed between the inner space and the outer space of the OLED display, and a central portion of at least one of the first substrate and the second substrate corresponding to the OLED is bent in the other direction due to the differences of the pressure. However, because a portion of the first substrate or the second substrate that corresponds to the sealant and that contacts the sealant sustains a state that is protruded upward further than the other portion, a portion of the protruded portion is bent. In this way, if a portion of the protruded portion of the first substrate or the second substrate is bent, there is a problem that a Newton's ring phenomenon occurs in the bent portion.

The exemplary embodiments will be described more fully hereinafter with reference to the accompanying drawings, in which exemplary embodiments are shown. As those skilled in the art would realize, the described embodiments may be modified in various different ways, all without departing from the spirit or scope of the present invention.

Further, like reference numerals designate like elements in several exemplary embodiments and are representatively described in the first exemplary embodiment, and different elements from those of the first exemplary embodiment will be described in other exemplary embodiments.

The drawings and description are to be regarded as illustrative in nature and not restrictive. Like reference numerals designate like elements throughout the specification.

Further, the size and thickness of each of elements that are displayed in the drawings are described for better understanding and ease of description, and the exemplary embodiment is not limited by the described size and thickness.

In the drawings, the thickness of layers, films, panels, regions, etc., are exaggerated for clarity. In the drawings, for better understanding and ease of description, thicknesses of some layers and areas are excessively displayed. When it is said that any part, such as a layer, film, region, or plate, is positioned on another part, it means the part is directly on the other part or above the other part with at least one intermediate part. In contrast, if any part is said to be positioned directly on another part, it means that there is no intermediate part between the two parts.

Further, in the accompanying drawings, an active matrix (AM) OLED display of a 2Tr-1Cap structure having two thin film, transistors (TFT) and one capacitor in one pixel is described, but the exemplary embodiment is not limited thereto. Therefore, the OLED display may have three or more TFTS and two or more capacitors in one pixel, and may have various other structures such as a separate wire. Here, a pixel is a minimum unit that displays an image, and the OLED display displays an image through a plurality of pixels.

Hereinafter, an OLED display 101 according to a first exemplary embodiment will be described with reference to FIGS. 1 to 5.

Figure 2:
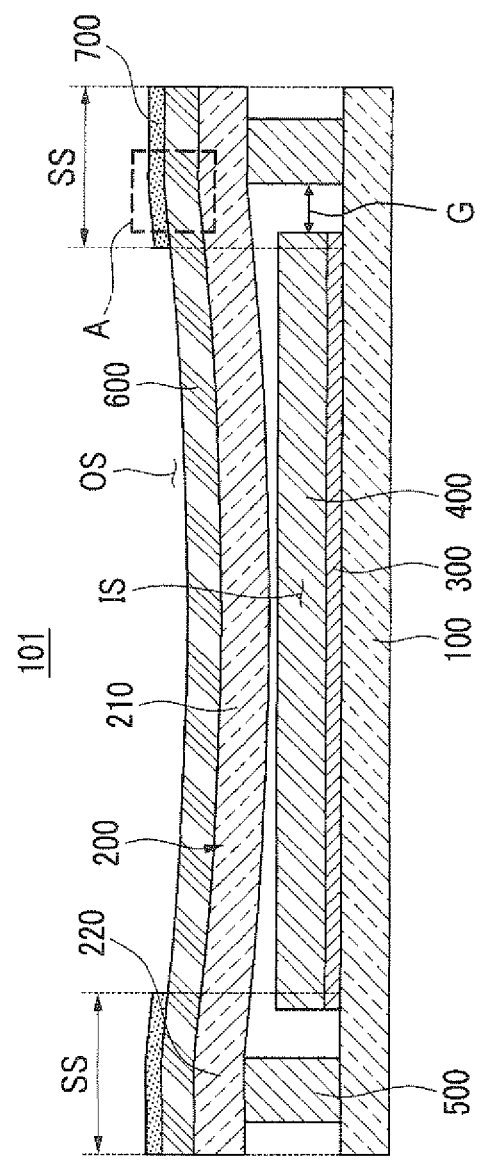
FIG. 2 is a cross-sectional view taken along line II-II of FIG. 1.

FIG. 1 is a top plan view illustrating an OLED display according to a first exemplary embodiment. FIG. 2 is a cross-sectional view taken along line II-II of FIG. 1.

As shown in FIGS. 1 and 2, the OLED display 101 according to the first exemplary embodiment includes a first substrate 100, a second substrate 200, a wire portion 300, an OLED 400, a sealant 500, an optical plate 600, and a scattering portion 700.

The first substrate 100 and the second substrate 200 are insulation substrates including glass, polymer, or stainless steel, and at least one of the first substrate 100 and the second substrate 200 is made of a light transmitting (or transparent) material. The wire portion 300 and the OLED 400 are positioned on the first substrate 100, and the second substrate 200 is positioned to face the first substrate 100. The wire portion 300 and the OLED 400 are interposed between the first substrate 100 and the second substrate 200. The first substrate 100 and the second substrate 200 are bonded, and a space between the first substrate 100 and the second substrate 200 is sealed by the sealant 500. The OLED 400 is disposed inside the space sealed by the sealant 500. The first substrate 100 and the second substrate 200 protect the wire portion 300 and the OLED 400 from external interference.

The second substrate 200 includes a central portion 210 disposed to correspond to the OLED 400 and an outer edge portion 220 disposed to correspond to the sealant 500. The central portion 210 of the second substrate 200 is bent in a direction of the OLED 400 by a pressure difference between an outer space OS and an inner space IS that are formed by the first substrate 100, the second substrate 200, and the sealant 500. As the central portion 210 of the second substrate 200 is bent in a direction of the OLED 400, the outer edge portion 220 of the second substrate 200 is bent with a steeper slope than the central portion 210 from a portion that is supported by the sealant 500 to the central portion 210. In this way, the outer edge portion 220 of the second substrate 200 is bent with a steeper slope than the central portion 210 of the second substrate 200. An area corresponding to the sealant 500 is referred to as a seal area SS. The seal area SS covers the sealant 500. In such a seal area SS, a Newton's ring phenomenon occurs due to offsetting, reinforcement, and interference by a plurality of lights such as light that is emitted from the OLED 400, light that is radiated from the outside to the inner space IS, and light that is reflected by the first substrate 100, the second substrate 200, and the OLED 400, and the Newton's ring phenomenon is minimized by the scattering portion 700 to be described later that is positioned at the seal area SS. A detailed description thereof will be given later together with that of the scattering portion 700.

The wire portion 300 includes first and second thin film transistors (TFTs) 10 and 20 (shown in FIG. 3), and drives the OLED 400 by transferring a signal to the OLED 400. The OLED 400 emits light according to a signal that is received from the wire portion 300.

The OLED 400 is positioned on the wire portion 300.

The OLED 400 is positioned at a display area on the first substrate 100, and is formed using microelectromechanical systems (MEMS) technology such as photolithography. The OLED 400 receives a signal from the wire portion 300 and displays an image by the received signal.

Hereinafter, an internal structure of the OLED display 101 according to the first exemplary embodiment will be described in detail with reference to FIGS. 3 and 4.

Figure 3:
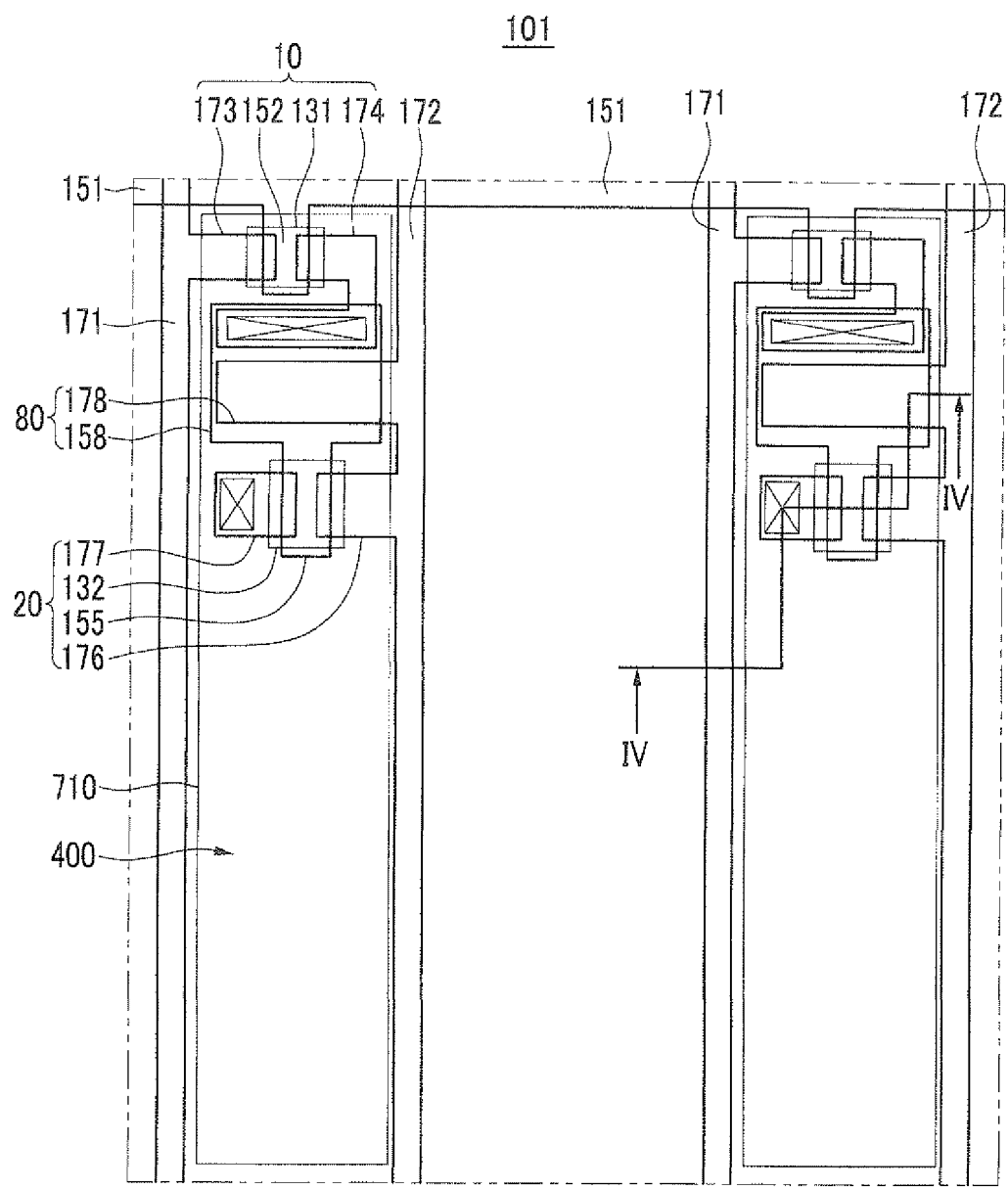
FIG. 3 is a layout view illustrating a structure of a pixel of the OLED display according to the first exemplary embodiment.

FIG. 3 is a layout view illustrating a structure of a pixel of the OLED display according to the first exemplary embodiment. FIG. 4 is a cross-sectional view taken along line IV-IV of FIG. 3.

Figure 4:
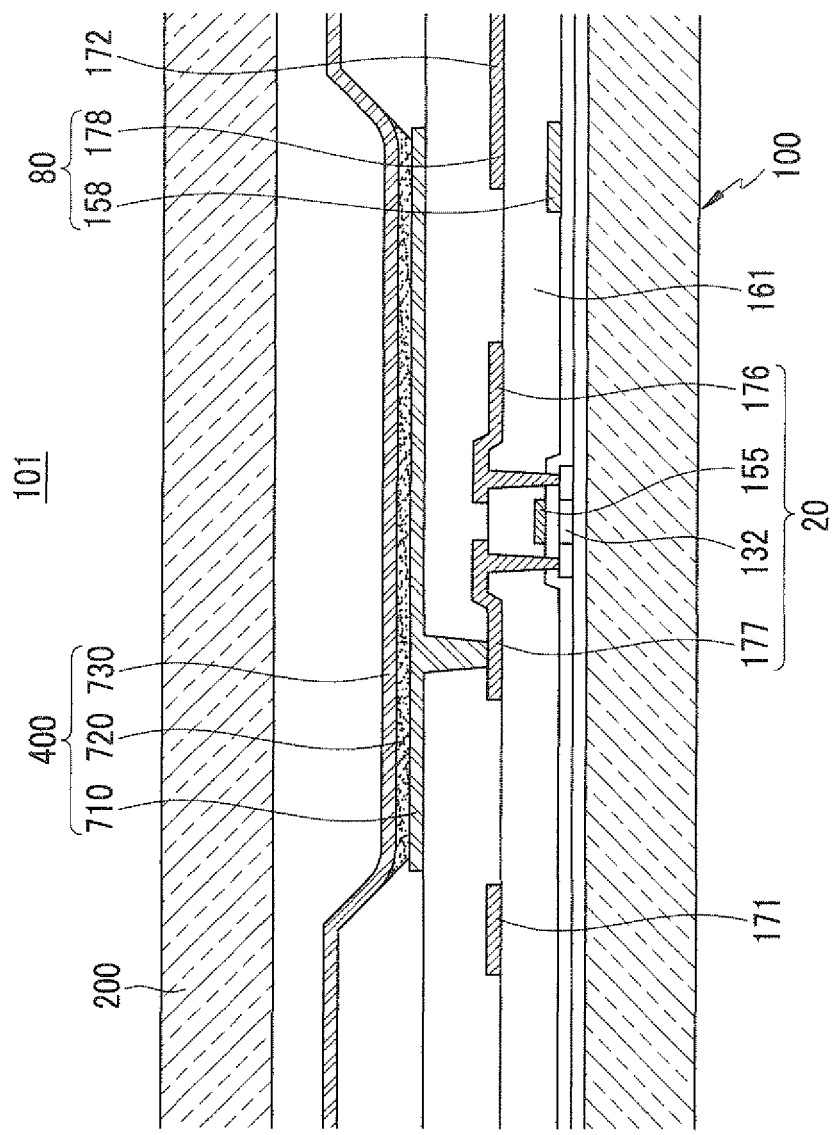
FIG. 4 is a cross-sectional view taken along line IV-IV of FIG. 3.

Hereinafter, a detailed structure of the wire portion 300 and the OLED 400 is described in FIGS. 3 and 4, but the present exemplary embodiment is not limited to the structure that is shown in FIGS. 3 and 4. The wire portion 300 and the OLED 400 can be formed in various structures within a range that can be easily modified by a person of ordinary skill in the art. For example, in the accompanying drawings, as an OLED display, an AM OLED display of a 2Tr-1Cap structure having two TFTs and one capacitor in one pixel is described, but the exemplary embodiment is not limited thereto. Therefore, in the display device, the number of the TFTs, the number of the capacitors, and the number of the wires are not limited. A pixel is a minimum unit that displays an image, and the OLED display displays an image through a plurality of pixels.

As shown in FIGS. 3 and 4, the OLED display 101 includes a switching TFT 10, a driving TFT 20, a capacitor 80, and an OLED 400 that are each formed in each pixel. Here, a configuration including the switching TFT 10, the driving TFT 20, and the capacitor 80 is referred to as a wire portion 300. The wire portion 300 further includes a gate line 151 that is disposed in one direction of the first substrate 100, and a data line 171 and a common power source line 172 that are insulated from and intersect the gate line 151. Here, a pixel is defined by the gate line 151, the data line 171, and the common power source line 172 as the boundary, but a pixel is not limited thereto.

The OLED 400 includes a first electrode 710, an organic emission layer 720 that is formed on the first electrode 710, and a second electrode 730 that is formed on the organic emission layer 720. The first electrode 710, the organic emission layer 720, and the second electrode 730 form the OLED 400. Here, the first electrode 710 is an anode, which is a hole injection electrode, and the second electrode 730 is a cathode, which is an electron injection electrode. However, the first exemplary embodiment is not limited thereto, and the first electrode 710 may be a cathode and the second electrode 730 may be an anode according to a driving method of the OLED display 101. When electrons and holes are injected into the organic emission layer 720 from the first electrode 710 and the second electrode 730, respectively, and when exams that are formed by coupling of holes and electrons that are injected into the organic emission layer 720 drop from an exited state to a ground state, the organic emission layer 720 emits light.

Further, the first electrode 710 of the OLED display 101 according to the first exemplary embodiment is made of a light reflecting material such as aluminum (Al), and the second electrode 730 is made of a light transmitting material including transparent or semitransparent indium tin oxide (ITO) or indium zinc oxide (IZO), but the exemplary embodiment is not limited thereto, and at least one of the first electrode 710 and the second electrode 730 can be transparent or semitransparent, or can be made of a conductive material.

Further, in the OLED display 101 according to the first exemplary embodiment, the OLED 400 emits light in a direction of the second substrate 200, but the exemplary embodiment is not limited thereto, and light that is emitted from the OLED 400 can be emitted in a direction of at least one of the first substrate 100 and the second substrate 200. That is, the OLED display 101 according to the first exemplary embodiment is a front light emitting type, but an OLED display according to other exemplary embodiments may be a rear light emitting type or a both light emitting type.

The capacitor 80 includes a pair of capacitor plates 158 and 178 that are disposed with an interlayer insulating layer 161 interposed therebetween. Here, the interlayer insulating layer 161 is a dielectric material, and a capacitor capacity of the capacitor 80 is determined by charges that are stored in the capacitor 80 and a voltage between both capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The switching TFT 10 is used as a switch that selects a pixel to emit light. The switching gate electrode 152 is connected to the gate line 151. The switching source electrode 173 is connected to the data line 171. The switching drain electrode 174 is separated from the switching source electrode 173 and is connected to one capacitor plate 158.

The driving TFT 20 applies a driving power source for allowing light emitting of the organic emission layer 720 of the OLED 400 within the selected pixel to the second electrode 730. The driving gate electrode 155 is connected to the capacitor plate 158 that is connected to the switching drain electrode 174. The driving source electrode 176 and the other capacitor plate 178 are each connected to the common power source line 172. The driving drain electrode 177 is connected to the first electrode 710 of the OLED 400 through a contact hole.

By such a structure, the switching TFT 10 operates by a gate voltage that is applied to the gate line 151 and thus performs a function of transferring a data voltage that is applied to the data line 171 to the driving TFT 20. A voltage corresponding to a difference between a common voltage that is applied from the common power source line 172 to the driving TFT 20 and a data voltage that is transferred from the switching TFT 10 is stored in the capacitor 80, and a current corresponding to the voltage that is stored in the capacitor 80 flows to the OLED 400 through the driving TFT 20, whereby the OLED 400 emits light.

Referring again to FIGS. 1 and 2, the sealant 500 is positioned between the first substrate 100 and the second substrate 200, and is disposed along the edge of the first substrate 100 and the second substrate 200 to bond the first and second substrates 100 and 200, and to seal the space between the first substrate 100 and the second substrate 200. The sealant 500 includes fit, and is cured by a curing means such as a laser. The sealant 500 encloses the OLED 400, and spaced apart by a predetermined gap G from the OLED 400. As shown in FIG. 2, the seal SS is defined as a portion covering the sealant 500 and the predetermined gap G. The seal area SS may or may not overlap with a portion of the OLED 400. A differential pressure of substantially 1 atmosphere is formed between an outer space OS and an inner space IS of the OLED display 101 that are formed by the sealant 500, the first substrate 100, and the second substrate 200. By the differential pressure, the sealant 500 sustains a state that is pressurized by the first substrate 100 and the second substrate 200. As described above, the sealant 500 is positioned to correspond to the seal area SS, and the outer edge portion 220 of the second substrate 200 is positioned to correspond to the seal area SS while corresponding portion to the sealant 500 is bent. The seal area SS corresponds to the sealant 500 to be positioned only at the outer edge portion 220 of the second substrate 200.

Figure 5:
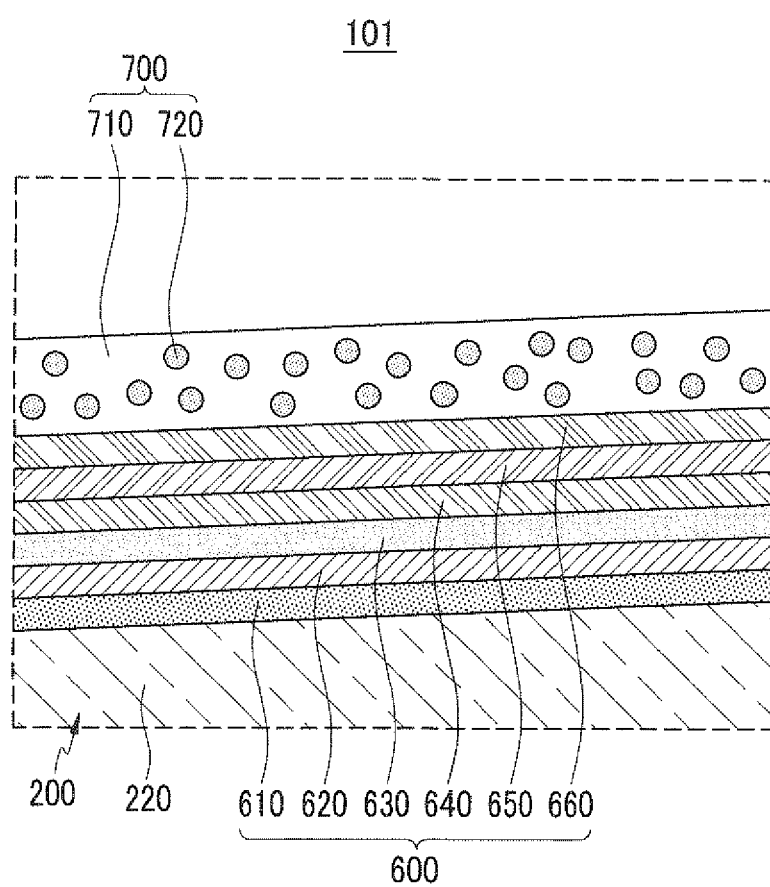
FIG. 5 is an enlarged view of a portion A of FIG. 2.

FIG. 5 is an enlarged view of a portion A of FIG. 2.

As shown in FIGS. 2 and 5, the optical plate 600 is positioned on the second substrate 200. The optical plate 600 optically handles light that is radiated to the optical plate 600 via the second substrate 200 by emitting light from the OLED 400 and light that is radiated from the outside to the optical plate 600, thereby suppressing external light reflection and thus minimizing loss of light that is emitted from the OLED 400 to the outside while improving visibility of the OLED display 101. The optical plate 600 includes a first adhesion film 610, a phase difference film 620, a second adhesion film 630, a first protection film 640, a polarizing film 650, and a second protection film 660 that are sequentially stacked from the second substrate 200.

The first adhesion film 610 and the second adhesion film 630 perform a function of bonding neighboring films, the phase difference film 620 performs a function of changing a phase of light that is radiated to the phase difference film 620, and the polarizing film 650 performs a function of transmitting only light having a phase corresponding to a phase that is set to the polarizing film 650. The first protection film 640 and the second protection film 660 are positioned with the polarizing film 650 interposed therebetween, and perform a function of protecting the polarizing film 650.

The scattering portion 700 is positioned on the optical plate 600.

The scattering portion 700 is positioned at the uppermost side of the OLED display 101, and is positioned to correspond to the seal area SS that corresponds to the sealant 500 to be positioned only at an outer edge portion of the second substrate 200. The scattering portion 700 corresponds to the sealant 500 that is positioned at the longer side of the second substrate 200. The scattering portion 700 performs a function of scattering all light that is radiated to the seal area SS. The scattering portion 700 includes a base layer 710 and scattering particles 720 that are positioned within the base layer 710. The base layer 710 is made of a resin, and the scattering particles 720 are made of a material having a different refractive index from that of the base layer 710. The scattering particles 720 perform a function of scattering light that is radiated to the scattering particles 720 in the base layer 710.

The scattering portion 700 is positioned only at the seal area SS, which is the outer edge portion 220 of the second substrate 200 in which a Newton's ring phenomenon occurs due to offsetting, reinforcement, and interference by a plurality of light beams such as light that is emitted from the OLED 400, light that is radiated from the outside to the inside space IS, and light that is reflected by the first substrate 100, the second substrate 200, and the OLED 400. As the scattering portion 700 is positioned only at the seal area SS, the scattering portion 700 scatters all light that is radiated to the seal area SS, thereby minimizing offsetting, reinforcement, and interference by light that causes a Newton's ring phenomenon. That is, due to a scattering phenomenon by the scattering portion 700, a Newton's ring phenomenon is minimized in the seal area SS, which is the outer edge portion 220 of the second substrate 200 in which a Newton's ring phenomenon occurs otherwise.

Further, the scattering portion 700 is positioned only at the seal area SS, which is the outer edge portion 220 of the second substrate 200, and if the scattering portion 700 is positioned at the central portion 210 of the second substrate 200 as well as the seal area SS, which is the outer edge portion 220 of the second substrate 200, all light that is emitted from the OLED 400 is scattered by the scattering portion 700 and thus a haze phenomenon occurs in an image that is emitted from the OLED 400 and that is viewed through the second substrate 200, whereby the display quality of the entire OLED display 101 deteriorates. That is, as the scattering portion 700 is selectively positioned only at the seal area SS, which is the outer edge portion 220 of the second substrate 200 in which a Newton's ring phenomenon mainly occurs. Therefore, while a Newton's ring phenomenon is minimized, deterioration of a display quality by the scattering portion 700 is also minimized.

The scattering particles 720 of the scattering portion 700 of the OLED display 101 according to the first exemplary embodiment are dispersed in the base layer 710, but in other exemplary embodiments, scattering particles 720 of the scattering portion 700 can be positioned at a location other than the base layer 710. Further, in the OLED display 101 according to the first exemplary embodiment, the scattering particles 720 have a form such as a grain, but in another exemplary embodiment, the scattering particles 720 of the scattering portion 700 can have a form of hemispherical groove that is depressed from an outer surface of the base layer 710.

Further, the scattering portion 700 of the OLED display 101 according to the first exemplary embodiment is positioned on the optical plate 600, but in another exemplary embodiment, the scattering portion 700 can be positioned within the optical plate 600. In other words, the scattering portion 700 can be positioned between the optical plate 600 and the second substrate 200.

Further, the scattering portion 700 of the OLED display 101, according to the first exemplary embodiment, is positioned to correspond to the sealant 500 that is positioned at the longer side of the second substrate 200, but in another exemplary embodiment, the scattering portion 700 can be positioned to correspond to all sealants 500 that are positioned at the shorter side as well as the longer side of the second substrate 200.

As described above, in the OLED display 101 according to the first exemplary embodiment, as the scattering portion 700 is selectively positioned at the seal area SS corresponding only to the outer edge portion 220 of the second substrate 200, while a Newton's ring phenomenon mainly occurring in the outer edge portion 220 of the second substrate 200 is minimized, deterioration of the display quality by the scattering portion 700 is suppressed in the central portion 210 of the second substrate 200, whereby deterioration of display quality of the entire organic light emitting display 101 is minimized.

Hereinafter, an OLED display 102 according to the second exemplary embodiment will be described with reference to FIG. 6.

Figure 6:
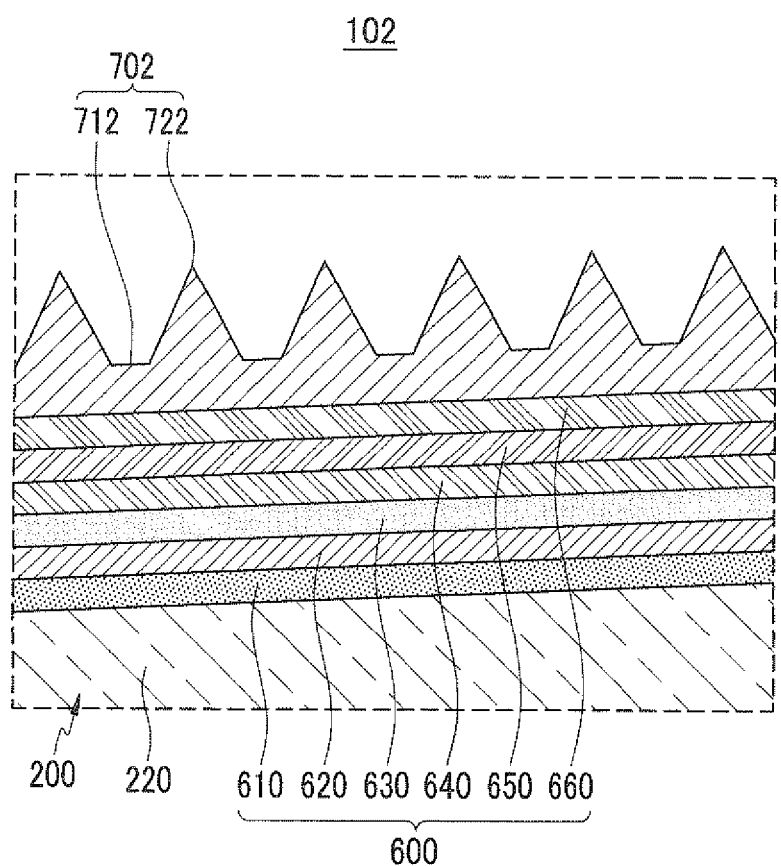
FIG. 6 is an enlarged cross-sectional view of a main portion of an OLED display according to a second exemplary embodiment.

FIG. 6 is an enlarged cross-sectional view of a main portion of the OLED display according to the second exemplary embodiment.

As shown in FIG. 6, a scattering portion 702 of the OLED display 102 according to the second exemplary embodiment is positioned at the uppermost side of the OLED display 102, and is positioned to correspond to a seal area SS that covers the sealant 500 positioned only at the outer edge side of the second substrate 200.

The scattering portion 702 performs a function of scattering all light that is radiated to the seal area SS, and has a protrusion and depression shape including a recess 712 and a protrusion 722. The scattering portion 702 can be formed on the optical plate 600 using photolithography technology using a half tone mask such as a transflective mask or a slit mask. The protrusion 722 of the scattering portion 702 has a sectional shape of at least one of a quadrangle, a triangle, and a circle.

The scattering portion 702 of the OLED display 102 according to the second exemplary embodiment has a uniform protrusion and depression form, but in other exemplary embodiments, the scattering portion 702 can have a non-uniform protrusion and depression form.

As described above, in the OLED display 102 according to the second exemplary embodiment, as the scattering portion 702 is selectively positioned at the seal area SS corresponding only to the outer edge portion 220 of the second substrate 200, while a Newton's ring phenomenon mainly occurring in the outer edge portion 220 of the second substrate 200 is minimized, deterioration of display quality by the scattering portion 702 is suppressed in the central portion 210 of the second substrate 200 and thus deterioration of display quality of the entire organic light emitting display 102 is minimized.

Further, because the scattering portion 702 of the OLED display 102 according to the second exemplary embodiment scatters light that is radiated to the scattering portion 702 using a protrusion and depression form, the scattering portion 702 can be simply formed by forming a protrusion and depression form in a surface such as various substrates, layers, or films. That is, in the OLED display 102 according to the second exemplary embodiment, because the scattering portion 702 can be simply formed, the scattering portion 702 can be easily applied to an existing OLED display.

Hereinafter, an OLED display 103 according to a third exemplary embodiment will be described with reference to FIGS. 7 and 8.

Figure 7:
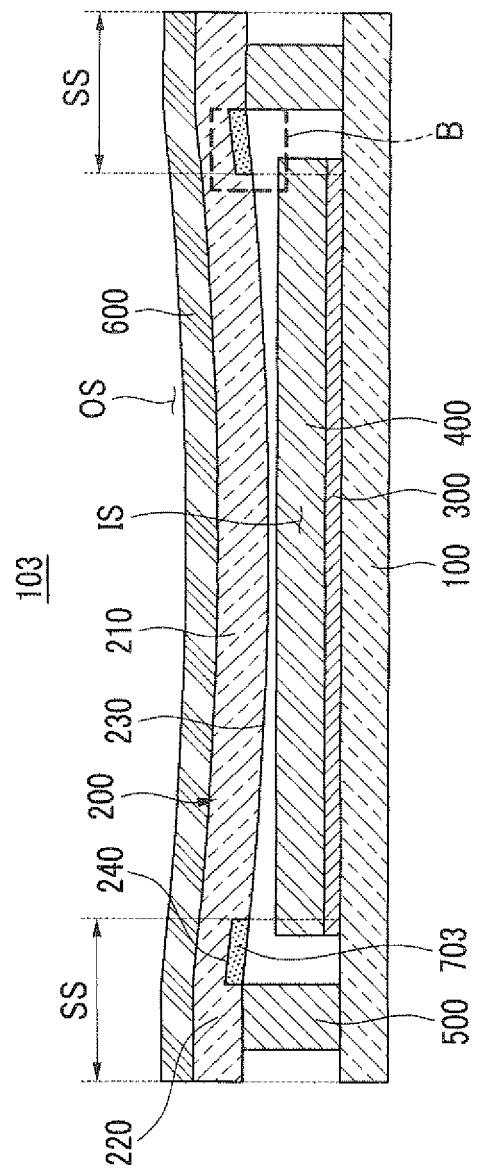
FIG. 7 is a cross-sectional view illustrating an OLED display according to a third exemplary embodiment.

FIG. 7 is a cross-sectional view illustrating the OLED display 103 according to the third exemplary embodiment. FIG. 8 is an enlarged view of a portion B of FIG. 7.

Figure 8:
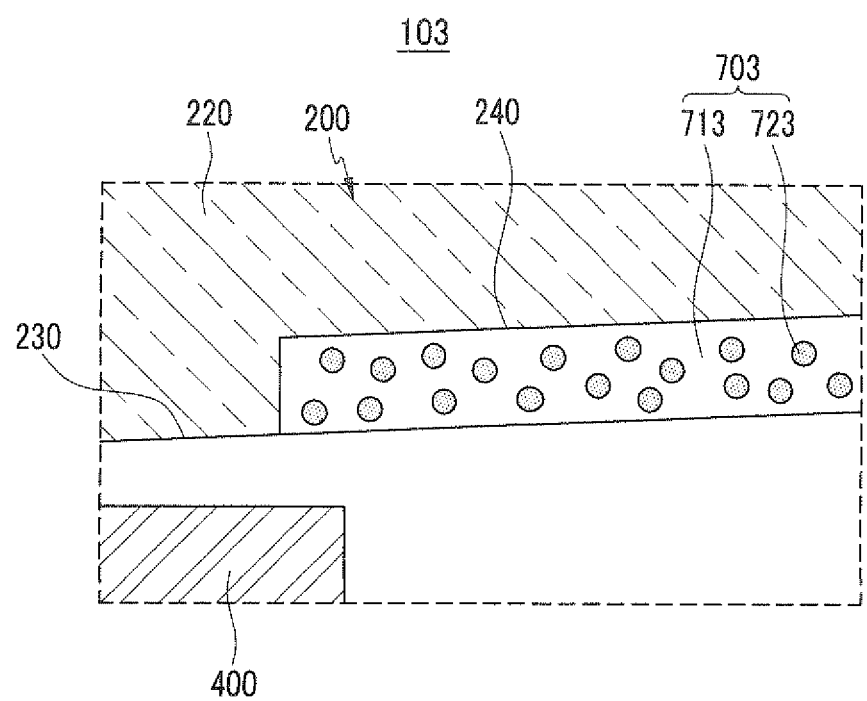
FIG. 8 is an enlarged view of a portion B of FIG. 7.

As shown in FIGS. 7 and 8, a second substrate 200 of the OLED display 103 according to the third exemplary embodiment faces a first substrate 100, and has an inner surface 230 that faces an OLED 400. The inner surface 230 has a substrate groove 240 that is recessed from the inner surface 230.

The substrate groove 240 can be formed in the second substrate 200 using a photolithography process, and is formed in a seal area SS corresponding to the outer edge portion 220 of the second substrate 200. As shown in FIG. 7, the substrate groove 240 may not overlap the sealant 500, and may be formed in the inner space IS enclosed by the sealant 500.

A scattering portion 703 is positioned within a substrate groove 240 that is recessed from the inner surface 230 of the second substrate 200.

The scattering portion 703 performs a function of scattering all light that is radiated to the seal area SS, and includes a base layer 713 and scattering particles 723 that are positioned within the base layer 713. The base layer 713 is formed with a resin, and the scattering particles 723 are made of a material having a different refractive index from that of the base layer 713. The scattering particles 723 perform a function of scattering light that is radiated to the scattering particles 723 via the base layer 713.

The scattering portion 703 is positioned only at a seal area SS, which is the outer edge portion 220 of the second substrate 200 in which a Newton's ring phenomenon occurs due to offsetting, reinforcement, and interference by a plurality of light beams such as light that is emitted from the OLED 400, light that is radiated from the outside to an inner space IS, and light that is reflected by the first substrate 100, the second substrate 200, and the OLED 400.

As described above, in the OLED display 103 according to the third exemplary embodiment, as the scattering portion 700 is selectively positioned at the seal area SS corresponding only to the outer edge portion 220 of the second substrate 200, while a Newton's ring phenomenon mainly occurring in the outer edge portion 220 of the second substrate 200 is minimized, deterioration of display quality by the scattering portion 700 is suppressed in the central portion 210 of the second substrate 200 and thus deterioration of display quality of the entire organic light emitting display 103 is minimized.

Further, in the OLED display 103 according to the third exemplary embodiment, because the scattering portion 703 is formed in the inner space IS, damage of a form thereof due to external interference is prevented.

Further, in the OLED display 103 according to the third exemplary embodiment, as the scattering portion 703 is positioned within the substrate groove 240 that is formed in the second substrate 200, reflection of light by the second substrate 200 is suppressed, and thus offsetting, reinforcement, and interference of light by the second substrate 200 does not occur, whereby a Newton's ring phenomenon that occurs in the seal area SS, which is the outer edge portion 220 of the second substrate 200, is suppressed.

Hereinafter, an OLED display 104 according to a fourth exemplary embodiment will be described with reference to FIG. 9.

Figure 9:
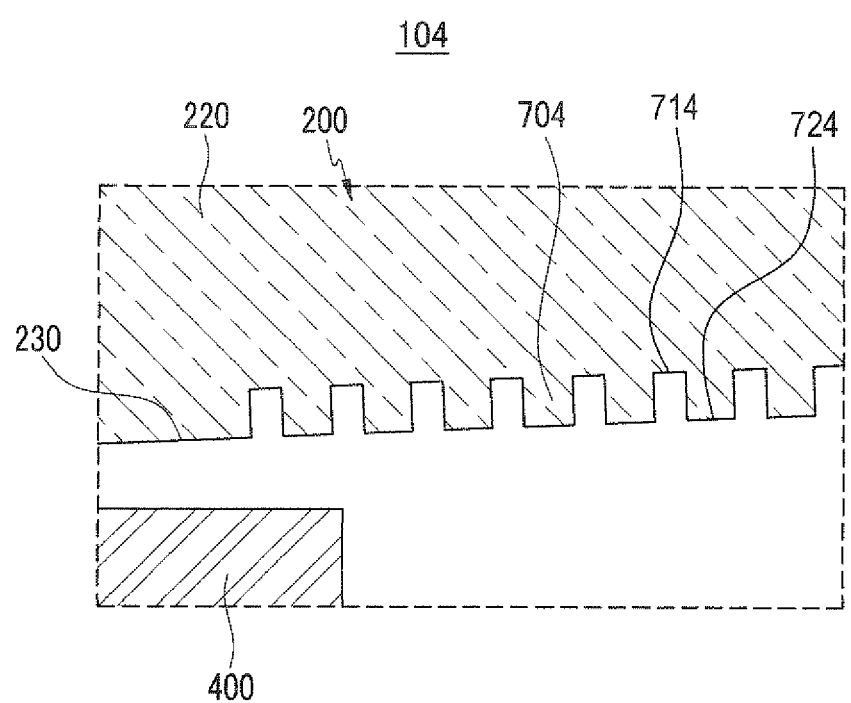
FIG. 9 is an enlarged cross-sectional view of a main portion of an OLED display according to a fourth exemplary embodiment.

FIG. 9 is an enlarged cross-sectional view of a main portion of the OLED display according to the fourth exemplary embodiment.

As shown in FIG. 9, in a scattering portion 704 of the OLED display 104 according to the fourth exemplary embodiment, a substrate groove 240 can be formed in the second substrate 200 using a photolithography process, and is formed in a seal area SS corresponding to the outer edge portion 220 of the second substrate 200.

The scattering portion 704 is patterned in a form of protrusions and depressions in an inner surface 230 of the second substrate 200. That is, the scattering portion 704 is patterned in a protrusion and depression form in the second substrate 200. As shown in FIG. 9, the scattering portion 704 includes a plurality of depressions 714 and a plurality of protrusions 724.

As the scattering portion 704 has a protrusion and depression form, the scattering portion 704 performs a function of scattering all light that is radiated to the scattering portion 704 by the protrusion and depression form. The scattering portion 704 is positioned only at the inner surface 230 of the second substrate 200 corresponding to the seal area SS, which is the outer edge portion 220 of the second substrate 200.

As described above, in the OLED display 104 according to the fourth exemplary embodiment, as the scattering portion 704 is selectively positioned at the seal area SS corresponding only to an outer edge portion 220 of the second substrate 200, while a Newton's ring phenomenon mainly occurring in the outer edge portion 220 of the second substrate 200 is minimized, deterioration of display quality by the scattering portion 704 is suppressed in the central portion 210 of the second substrate 200 and thus deterioration of display quality of the entire organic light emitting display 104 is minimized.

Further, in the OLED display 104 according to the fourth exemplary embodiment, because the scattering portion 704 is formed in an inner space IS, damage of a form thereof due to external interference is prevented.

Further, in the OLED display 104 according to the fourth exemplary embodiment, because the scattering portion 704 is patterned in the inner surface 230 of the second substrate 200, reflection of light due to the second substrate 200 is suppressed, and thus offsetting, reinforcement, and interference of light by the second substrate 200 does not occur, whereby a Newton's ring phenomenon that occurs in the seal area SS, which is the outer edge portion 220 of the second substrate 200, is suppressed.

Further, because the scattering portion 704 of the OLED display 104 according to the fourth exemplary embodiment scatters light that is radiated to the scattering portion 704 using a protrusion and depression form, the scattering portion 704 can be simply formed by patterning the second substrate 200. That is, because the OLED display 104 according to the fourth exemplary embodiment can simply form the scattering portion 704, when preparing the second substrate 200, the scattering portion 704 is integrally formed with the second substrate 200, and thus production time and production cost can be reduced.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
    a first substrate;
    a second substrate disposed to face the first substrate;
    an organic light emitting diode disposed between the first substrate and the second substrate, the organic light emitting diode emitting light;
    a sealant positioned between the first substrate and the second substrate, the sealant sealing a space between the first substrate and the second substrate, the organic light emitting diode being spaced apart from the sealant by a predetermined gap; and
    a scattering portion positioned at a seal area covering the predetermined gap, the scattering portion not covering the sealant, the scattering portion scattering incident light, the second substrate having an inner surface facing the first substrate, the scattering portion disposed on the inner surface of the second substrate.

2. The OLED display of claim 1, wherein the sealant is disposed along an edge portion of the second substrate and encloses the organic light emitting diode, the sealant being positioned only at the edge portion of the second substrate.

3. The OLED display of claim 2, wherein a portion of the edge portion of the second substrate, which is not supported by the sealant, is bent forming a bent portion.

4. The OLED display of claim 3, wherein the scattering portion is disposed on the bent portion of the edge portion of the second substrate.

5. The OLED display of claim 1, further comprising an optical plate positioned on the second substrate, the scattering portion being positioned on the optical plate.

6. The OLED display of claim 1, wherein the inner surface of the second substrate has a substrate groove, the scattering portion being disposed in the substrate groove.

7. The OLED display of claim 6, wherein the scattering portion comprises:
    a base layer; and
    scattering particles disposed inside the base layer.

8. The OLED display of claim 1, wherein the scattering portion includes protrusions and depressions.

9. An organic light emitting diode (OLED) display comprising:
    a first substrate;
    a second substrate disposed to face the first substrate;
    an organic light emitting diode disposed between the first substrate and the second substrate, the organic light emitting diode emitting light;
    a sealant positioned between the first substrate and the second substrate, the sealant sealing a space between the first substrate and the second substrate, the organic light emitting diode being spaced apart from the sealant by a predetermined gap, a gap between the first substrate and the second substrate in an edge portion of the second substrate being different from a gap between the first substrate and the second substrate in a central portion of the second substrate; and
    a scattering portion positioned to cover the predetermined gap, the scattering portion not covering the sealant, the scattering portion scattering incident light, the second substrate having an inner surface facing the first substrate, the scattering portion disposed on the inner surface of the second substrate.

10. The OLED display of claim 9, wherein the scattering portion is formed by patterning the second substrate.

11. The OLED display of claim 9, wherein the scattering portion comprises:
    a base layer; and
    scattering particles disposed inside the base layer.

12. The OLED display of claim 9, wherein the scattering portion is formed in a protrusion and depression shape including a plurality of recesses and a plurality of protrusions.

13. The OLED display of claim 1, wherein the scattering portion is formed in a protrusion and depression shape including a plurality of recesses and a plurality of protrusions.

* * * * *